(12) United States Patent
Moon et al.

(10) Patent No.: US 10,769,066 B2
(45) Date of Patent: Sep. 8, 2020

(54) NONVOLATILE MEMORY DEVICE, DATA STORAGE DEVICE INCLUDING THE SAME AND OPERATING METHOD THEREOF

(71) Applicant: SK hynix Inc., Gyeonggi-do (KR)

(72) Inventors: Min Hwan Moon, Seoul (KR); Min Gu Kang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/530,697

(22) Filed: Aug. 2, 2019

(65) Prior Publication Data

US 2020/0073804 A1 Mar. 5, 2020

(30) Foreign Application Priority Data

Aug. 29, 2018 (KR) .................. 10-2018-0102153

(51) Int. Cl.
*G11C 11/40* (2006.01)
*G06F 12/0811* (2016.01)
*G06F 12/02* (2006.01)
*G11C 11/409* (2006.01)

(52) U.S. Cl.
CPC ...... *G06F 12/0811* (2013.01); *G06F 12/0246* (2013.01); *G11C 11/409* (2013.01); *G06F 2212/1021* (2013.01); *G06F 2212/7201* (2013.01)

(58) Field of Classification Search
CPC ..... G11C 11/418; G11C 11/409; G11C 15/00; G06F 12/0811
See application file for complete search history.

(56) References Cited

U.S. PATENT DOCUMENTS

2015/0074329 A1* 3/2015 Kondo .............. G06F 12/1408
711/103
2018/0165012 A1* 6/2018 Kishida ................ G06F 3/0619

FOREIGN PATENT DOCUMENTS

KR 1020140057454 5/2014

* cited by examiner

*Primary Examiner* — Han Yang
(74) *Attorney, Agent, or Firm* — IP & T Group LLP (57) ABSTRACT

A nonvolatile memory device may include a plurality of dies. Each of the plurality of dies may store mapping information of logical block addresses which are previously assigned. When a composite read command and location information indicating where mapping information of a logical block address is stored are received from a controller, a target die corresponding to the logical block address among the plurality of dies may perform a first operation of translating the logical block address to a physical block address based on the location information, and a second operation of reading user data stored in a region of the translated physical block address and outputting the read user data to the controller.

14 Claims, 11 Drawing Sheets

| User Data 0 | User Data 1 | User Data 2 | User Data 3 |
| --- | --- | --- | --- |
| User Data 4 | User Data 5 | User Data 6 | User Data 7 |
| User Data 8 | User Data 9 | User Data 10 | User Data 11 |
| ⋮ | ⋮ | ⋮ | ⋮ |
| Die 0 | Die 1 | Die 2 | Die 3 |

United States Patent

NONVOLATILE MEMORY DEVICE, DATA STORAGE DEVICE INCLUDING THE SAME AND OPERATING METHOD THEREOF

CROSS-REFERENCE TO RELATED APPLICATION

The present application claims priority under 35 U.S.C. § 119(a) to Korean application number 10-2018-0102153, filed on Aug. 29, 2018, in the Korean Intellectual Property Office, which is incorporated herein by reference in its entirety.

BACKGROUND

1. Technical Field

Various embodiments generally relate to a semiconductor device, and more particularly, to a nonvolatile memory device, a data storage device including the same, and an operating method thereof.

2. Related Art

Recently, the paradigm for the computing environment has changed to the ubiquitous computing environment in which computer systems can be used anytime anywhere. Therefore, the use of portable electronic devices such as mobile phones, digital cameras and notebook computers has rapidly increased. Such portable electronic devices generally use a data storage device using a memory device. The data storage device is used to store data which are used in the portable electronic devices.

Since a data storage device using a memory device has no mechanical driver, the data storage device has excellent stability and durability, high information access speed, and low power consumption. A data storage device having such advantages includes a universal serial bus (USB) memory device, a memory card having various interfaces, a universal flash storage (UFS) device, and a solid state drive (SSD).

SUMMARY

Various embodiments are directed to a nonvolatile memory device capable of preventing a reduction in speed of a read operation even when a map cache miss occurs, a data storage device including the same, and an operating method thereof.

In an embodiment, a nonvolatile memory device may include: a plurality of dies, each configured to store mapping information of logical block addresses which are previously assigned. When a composite read command and location information indicating where mapping information of a logical block address, of the logical block addresses, is stored are received from a controller, a target die corresponding to the logical block address among the plurality of dies may perform a first operation of translating the logical block address to a physical block address based on the location information, and a second operation of reading user data stored in a region of the translated physical block address and outputting the read user data to the controller.

In an embodiment, a data storage device may include: a nonvolatile memory device including a plurality of dies, wherein each of the plurality of dies stores mapping information of logical block addresses which are previously assigned; a memory configured to cache mapping information of a logical block address received from a host device; and a controller configured to transfer a composite read command and location information to a target die among the plurality of dies, when a logical block address which is not cached in the memory is received from the host device. The location information indicates where mapping information of the logical block address is stored, and the target die corresponds to the logical block address.

In an embodiment, there is provided an operating method of a data storage device which includes a nonvolatile memory device including a plurality of dies configured to store mapping information of a previously assigned logical block address group and a controller configured to control the nonvolatile memory device. The operating method may include: determining, by the controller, whether a map cache hit for a logical block address received from a host device occurs; transferring, by the controller, a composite read command and location information to a target die corresponding to the logical block address, the location information indicating where mapping information of the logical block address is stored, when it is determined that a map cache miss occurs; and performing, by the target die, a first operation of translating the logical block address into a physical block address based on the location information and a second operation of reading user data stored in a region of the physical block address and outputting the read user data to the controller.

In an embodiment, a data storage device may include: a nonvolatile memory device configured to store user data and one or more logical address to physical address (L2P) entries, each representing a mapping relation between a logical address and a physical address for the user data; and a controller configured to: store location information indicating the L2P entries with respect to corresponding logical addresses; locate a L2P entry corresponding to a provided logical address based on the location information; and control the nonvolatile memory device to access the user data of a physical address represented by the located L2P entry.

DETAILED DESCRIPTION

A nonvolatile memory device, a data storage device including the same, and an operating method thereof are described below with reference to the accompanying drawings through various embodiments. Throughout the specification, reference to "an embodiment" or the like is not necessarily to only one embodiment, and different references to any such phrase are not necessarily to the same embodiment(s).

Figure 1:
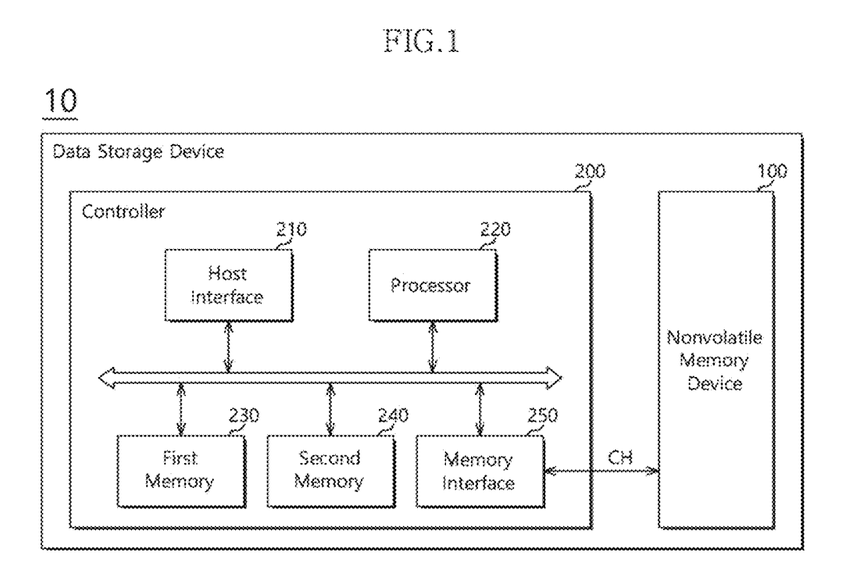
FIG. 1 is a block diagram illustrating a data storage device in accordance with an embodiment.

FIG. 1 is a block diagram illustrating a configuration of a data storage device 10 in accordance with an embodiment.

The data storage device 10 may store data accessed by a host device (not illustrated) such as a mobile phone, MP3 player, laptop computer, desktop computer, game machine, TV or in-vehicle infotainment system. The data storage device 10 may be referred to as a memory system.

The data storage device 10 may be configured as any of various types of storage devices, depending on a host interface indicating a transfer protocol with the host device. For example, the data storage device 10 may be configured as any of a solid state drive (SSD), a multi-media card (MMC) such as an eMMC, RS-MMC or micro-MMC, a secure digital (SD) card such as a mini-SD or micro-SD, a universal serial bus (USB) storage device, a universal flash storage (UFS) device, a personal computer memory card international association (PCMCIA) card-type storage device, a peripheral component interconnection (PCI) card-type storage device, a PCI express (PCI-E) card-type storage device, a compact flash (CF) card, a smart media card and a memory stick.

The data storage device 10 may be fabricated as any of various types of packages, such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

Referring to FIG. 1, the data storage device 10 may include a nonvolatile memory device 100 and a controller 200.

The nonvolatile memory device 100 may operate as a storage medium of the data storage device 10. The nonvolatile memory device 100 may be configured as any of various types of nonvolatile memory devices such as a NAND flash memory device, a NOR flash memory device, a ferroelectric random access memory (FRAM) using ferroelectric capacitors, a magnetic random access memory (MRAM) using a tunneling magneto-resistive (TMR) layer, a phase change random access memory (PRAM) using chalcogenide alloys, and a resistive random access memory (ReRAM) using transition metal oxide, depending on memory cells. The nonvolatile memory device 100 will be described in detail with reference to the drawings.

The controller 200 may include a host interface 210, a processor 220, a first memory 230, a second memory 240 and a memory interface 250.

The host interface 210 may interface the host device and the data storage device 10. For example, the host interface 210 may communicate with the host device through any of standard transfer protocols such as USB (universal serial bus), UFS (universal flash storage), MMC (multimedia card), PATA (parallel advanced technology attachment), SATA (serial advanced technology attachment), SCSI (small computer system interface), SAS (serial attached SCSI), PCI (peripheral component interconnection) and PCI-E (PCI express).

The processor 220 may include a micro control unit (MCU) and/or a central processing unit (CPU). The processor 220 may process requests received from the host device. In order to process the requests received from the host device, the processor 220 may drive a code-based instruction or algorithm loaded to the first memory 230, i.e. software, and control the internal function blocks and the nonvolatile memory device 100.

The first memory 230 may be configured as a RAM such as a dynamic RAM (DRAM) or static RAM (SRAM). The first memory 230 may temporarily store data to be transferred to the nonvolatile memory device 100 from the host device or data to be transferred to the host device from the nonvolatile memory device 100. That is, the memory 230 may operate as a buffer memory.

The first memory 230 may store first map data (not illustrated). The first map data may be referred to as L1 map data. The L1 map data may include location information on a plurality of L2 map chunks stored in the nonvolatile memory device 100. Each of the plurality of L2 map chunks includes a plurality of logical-block-address to physical-block-address (L2P) entries. The L1 map data may be stored in a specific region of the nonvolatile memory device 100, for example, a system region 100A (see FIG. 2). The L1 map data may be read from the system region 100A of the nonvolatile memory device 100 and loaded to the first memory 230 while the data storage device 10 is booted up.

The second memory 240 may be configured as a RAM such as a dynamic RAM (DRAM) or static RAM (SRAM). The second memory 240 may store software driven by the processor 220. Furthermore, the second memory 240 may store data required for driving the software, for example, metadata. That is, the second memory 240 may operate as a working memory of the processor 220. The second memory 240 may cache one or more L2 map chunks among the plurality of L2 map chunks stored in the nonvolatile memory device 100. That is, the second memory 240 may operate as a map cache buffer. The plurality of L2 map chunks may be stored in a specific region of the nonvolatile memory device 100, for example, a map data region 100B (see FIG. 2). The L2 map chunks cached in the second memory 240 may include logical block addresses corresponding to frequent read requests from the host device or logical block addresses corresponding to recent read requests.

FIG. 1 illustrates that both of the first and second memories 230 and 240 are disposed in the controller 200. However, the present invention is not limited to this specific configuration. Either or both of the first or second memory 230 or 240 may be disposed externally to the controller 200.

The memory interface 250 may control the nonvolatile memory device 100 under control of the processor 220. The memory interface 250 may also be referred to as a memory controller. The memory interface 250 may provide control signals to the nonvolatile memory device 100. The control signals may include a command and address for controlling an operation of the nonvolatile memory device 100. The memory interface 250 may provide data to the nonvolatile memory device 100, or receive data from the nonvolatile memory device 100. The memory interface 250 may be coupled to the nonvolatile memory device 100 through a channel CH including one or more signal lines.

Figure 2:
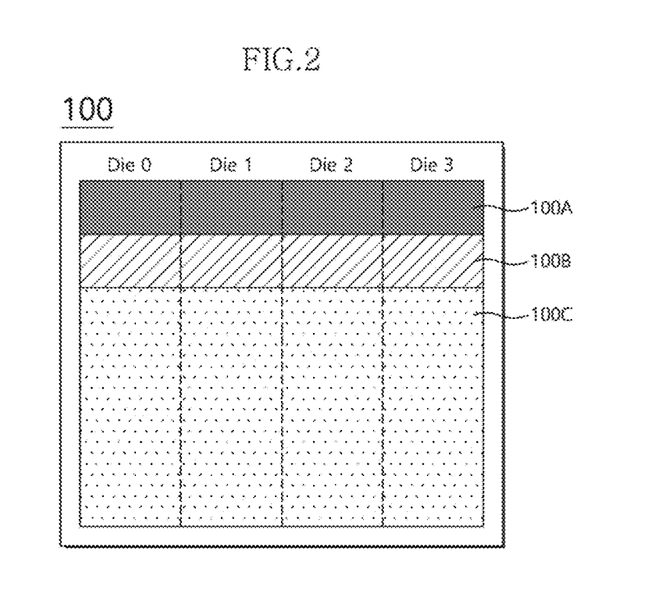
FIG. 2 illustrates a memory region of a nonvolatile memory device.
Figure 3:
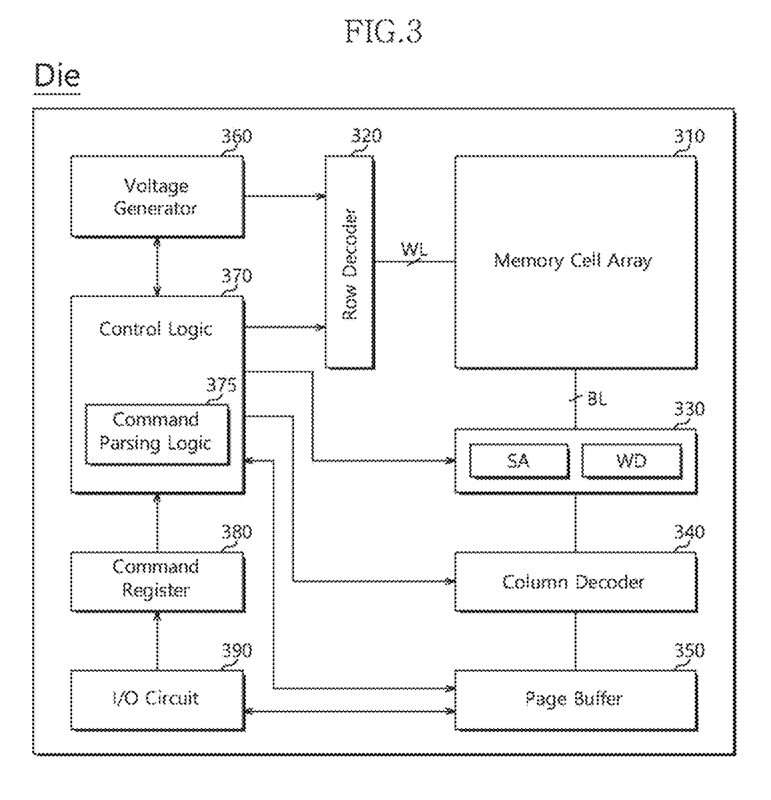
FIG. 3 illustrates a configuration of each die of FIG. 2.

FIG. 2 illustrates a memory region of the nonvolatile memory device 100, and FIG. 3 illustrates a configuration of each die of FIG. 2.

Referring to FIG. 2, the nonvolatile memory device 100 may include a plurality of dies. FIG. 2 illustrates that the nonvolatile memory device 100 includes four dies Die_0 to Die_3, but the present invention is not limited to that specific configuration. More or less than three dies may be included in the nonvolatile memory device 100 depending on system design and use considerations. By way of example, the following description is given in the context that the nonvolatile memory device 100 includes four dies Die_0 to Die_3.

Each of the four dies Die_0 to Die_3 in the nonvolatile memory device 100 may include a memory region, and the memory region of each die may include a first region 100A, a second region 100B and a third region 100C. For example, the first region 100A may be a system region in which system data or metadata are stored, the second region 100B may be a map data region in which L2P entries (i.e., the plurality of map chunks) are stored, and the third region 100C may be a user data region in which user data received from the host device are stored. The above-described L1 map data may be stored in the system region 100A.

The first regions 100A of the first to fourth dies Die_0 to Die_3 may be grouped into a single first region 100A. Similarly, the second regions 100B of the first to fourth dies Die_0 to Die_3 may be grouped into a single second region 100B, and the third regions 100C of the first to fourth dies Die_0 to Die_3 may be grouped into a single third region 100C. When a plurality of regions are grouped into a single region, it may indicate that the physically separate regions are recognized and used as a single region which is logically connected.

Referring to FIG. 3, each of the dies Die_0 to Die_3 of the nonvolatile memory device 100 may include a memory cell array 310, a row decoder 320, a read/write circuit 330, a column decoder 340, a page buffer 350, a voltage generator 360, control logic 370, a command register 380 and an input/output (I/O) circuit 390. The row decoder 320, the read/write circuit 330, the column decoder 340, the page buffer 350 and the voltage generator 360 may be collectively referred to as a peripheral circuit. The control logic 370 may include command parsing logic 375.

The memory cell array 310 may include a plurality of memory cells (not illustrated) arranged at the respective intersections between a plurality of bit lines BL and a plurality of word lines WL. The memory cell array 310 may include a plurality of memory blocks (not illustrated), and each of the memory blocks may include a plurality of pages (not illustrated).

For example, each memory cell of the memory cell array 310 may be a single level cell (SLC) for storing 1-bit data, a multi-level cell (MLC) for storing 2-bit data, a triple level cell (TLC) for storing 3-bit data, or a quadruple level cell (QLC) for storing 4-bit data. The memory cell array 310 may include one or more of the SLCs, the MLCs, the TLCs and the QLCs. Also, the memory cell array 310 may include memory cells with a two-dimensional horizontal structure or memory cells with a three-dimensional vertical structure.

The row decoder 320 may be coupled to the memory cell array 310 through the word lines WL. The row decoder 320 may operate under control of the control logic 370. The row decoder 320 may decode a row address provided from an external device, i.e. the controller 200, and select and drive one or more word lines of the word lines WL based on the decoding result. The row decoder 320 may provide a word line voltage provided from the voltage generator 360 to the selected word line WL.

The read/write circuit 330 may be coupled to the memory cell array 310 through the bit lines BL. The read/write circuit 330 may include read/write circuits (not illustrated) corresponding to the respective bit lines BL. The read/write circuit 330 may operate under control of the control logic 370. The read/write circuit 330 may operate as a write driver WD or a sense amplifier SA depending on operation modes. The read/write circuit 330 may operate as a write driver WD for storing data provided from the controller 200 in the memory cell array 310 during a write operation. The read/write circuit 330 may operate as a sense amplifier SA for reading data from the memory cell array 310 during a read operation.

The column decoder 340 may operate under control of the control logic 370. The column decoder 340 may decode a column address provided from the controller 200. The column decoder 340 may couple the read/write circuits of the read/write circuit 330, corresponding to the respective bit lines BL, to the page buffer 350 based on the decoding result.

The page buffer 350 may temporarily store write data which are provided from the controller 200 so as to be stored in the memory cell array 310, or read data which are read from the memory cell array 310 so as to be provided to the controller 200. The page buffer 350 may operate under control of the control logic 370.

The voltage generator 360 may generate a voltage used for an internal operation of the die. The voltage generator 360 may generate a voltage used for an internal operation of the die, using power applied from the host device, and provide the generated voltage to the memory cell array 310, the peripheral circuit, the control logic 370 and the like. The voltages generated by the voltage generator 360 may be applied to the memory cells of the memory cell array 310.

The control logic 370 may control overall operations of the die based on the control signals provided from the controller 200. For example, the control logic 370 may control an operation of the peripheral circuit of the die to perform read, write and erase operations on the memory cell array 310, according to a read command, a write command and an erase command which are provided from the controller 200.

The command parsing logic 375 may parse commands stored in the command register 380, and provide the parsing result to the control logic 370. For example, the command parsing logic 375 may parse a command stored in the command register 380 to determine whether the command is a normal read command or composite read command, and provide the determination result to the control logic 370. The control logic 370 may control the peripheral circuit to perform an operation corresponding to the normal read command or the composite read command based on the determination result provided from the command parsing logic 375. This operation will be described in detail with reference to the following drawings.

The command register 380 may be configured to sequentially store commands outputted from the I/O circuit 390, and provide the commands to the command parsing logic 375 according to the order that the commands are stored.

The I/O circuit 390 may be configured to receive a command, an address and data which are provided from the controller 200 or provide the controller 200 with status information and data which are read from the memory cell array 310. The I/O circuit 390 may output the command and address provided from the controller 200 to the command register 380, and output the data provided from the controller 200 to the page buffer 350. The I/O circuit 390 may operate under control of the control logic 370.

Figure 4:
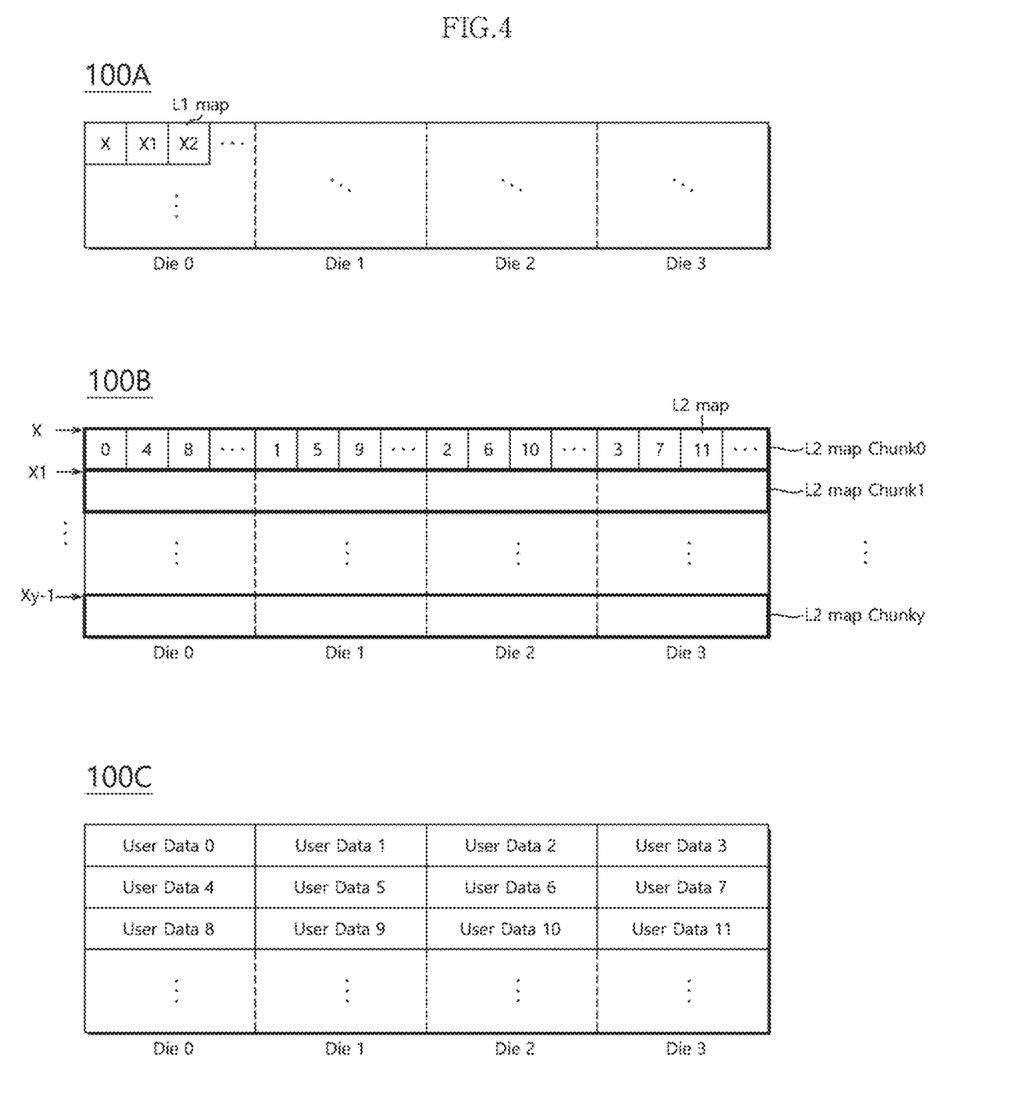
FIG. 4 illustrates a system region, a map data region and a user data region which are included in a nonvolatile memory device.

FIG. 4 illustrates the system region 100A, the map data region 100B and the user data region 100C which are included in the nonvolatile memory device 100.

Referring to FIG. 4, L1 map data may be stored in the system region 100A, L2P entries (or L2 map data) may be stored in the map data region 100B, and user data may be stored in the user data region 100C.

Referring to FIG. 4, the L2P entries stored in pages coupled to a word line may be grouped into one L2 map chunk in the map data region 100B. The L2P entries included in the L2 map chunk may be stored in dies respectively corresponding to the logical block addresses thereof. For example, the logical block addresses of L2P entries stored in a page coupled to a word line of a die may have a specific offset therebetween. FIG. 4 illustrates that the offset between the logical block addresses of the L2P entries within a L2 map chunk for each of the dies is set to '4'. However, the present invention is not limited to this specific offset; the offset may be any suitable value.

That is, in an embodiment, logical block addresses may be set for each of the dies as illustrated in FIG. 4. Thus, each of the L2P entries may be stored in the map data region 100B so as to be included in the corresponding L2 map chunk in the corresponding die. Therefore, when a request and a logical block address are received from the host device, the controller 200 may transfer a command to a die corresponding to the logical block address in response to the request.

The L1 map data stored in the system region 100A may be updated when a map update operation is performed on the corresponding L2 map chunk. As described above, the L1 map data may include location information indicating the L2P entries in the L2 map chunks stored in the nonvolatile memory device 100. The controller 200 may read an L2 map chunk, on which the map update operation is to be performed, from the map data region 100B of the nonvolatile memory device 100, store the read L2 map chunk in the first memory 230 or the second memory 240 of the controller 200, and change mapping information within L2P entries whose mapping information is to be changed, among the L2P entries included in the L2 map chunk stored in the first memory 230 or the second memory 240. The L2 map chunk whose mapping information has been completely changed needs to be stored back in the map data region 100B of the nonvolatile memory device 100. The L2 map chunk may be stored at a location different from the previous location where the L2 map chunk had been read. Thus, the location information of the updated L2 map chunk may be changed, and the changed location information of the L2 map chunk needs to be reflected into the L1 map data.

User data may be stored in a die to which a corresponding logical block address is applied in the user data region 100C. For this operation, the controller 200 may have information on logical block addresses assigned to each of the dies, and provide a write command to a corresponding die based on the corresponding information.

Figure 5A:
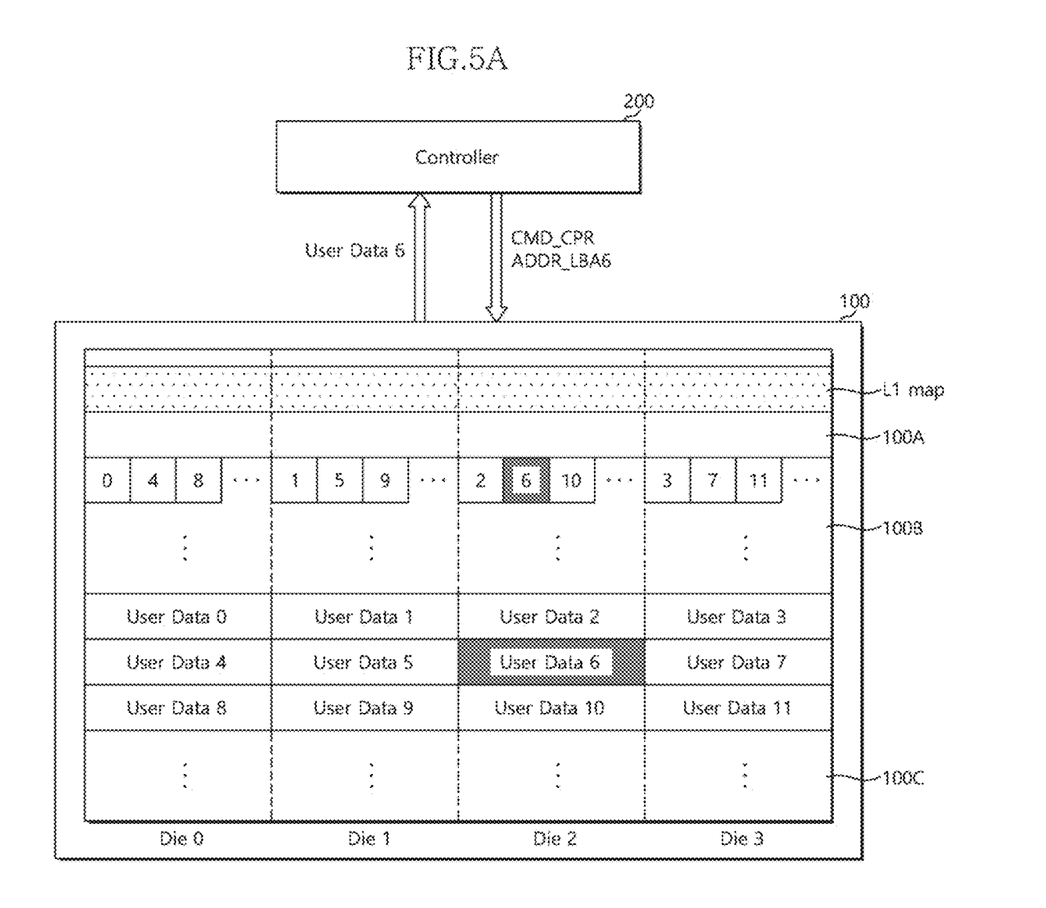
FIGS. 5A and 5B illustrate a read operation in accordance with an embodiment.
Figure 5B:
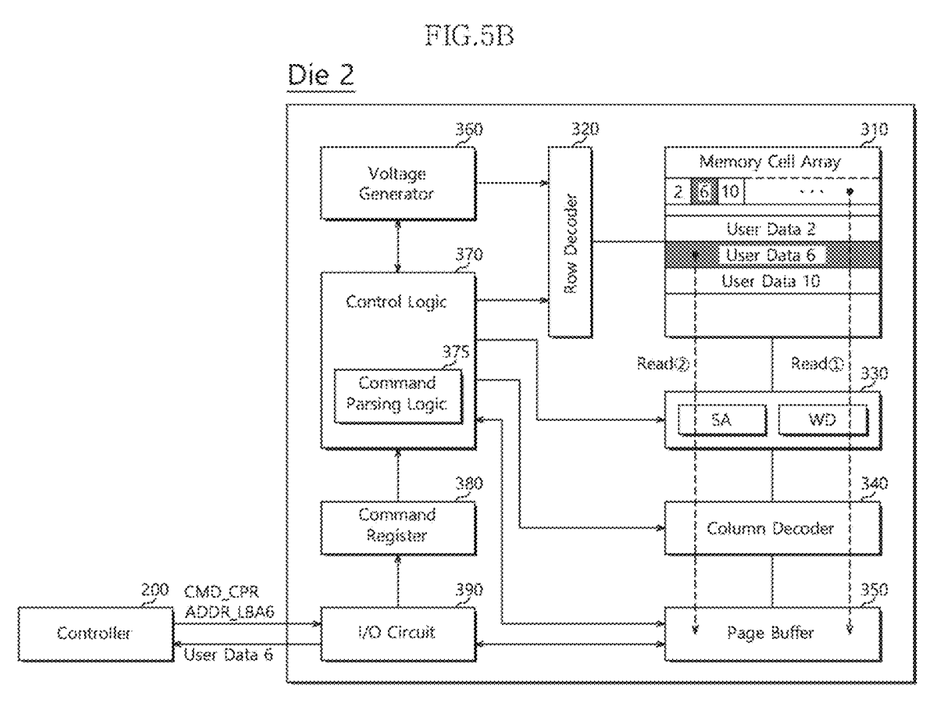

FIGS. 5A and 5B illustrate the read operation in accordance with an embodiment. Specifically, FIG. 5A illustrates a read operation that is performed in the nonvolatile memory device 100, and FIG. 5B illustrates a read operation that is performed in a target die.

Referring to FIGS. 5A and 5B, the controller 200 may transfer a composite read command CMD_CPR and a logical block address LBA6 received from the host device to the nonvolatile memory device 100. The controller 200 may transfer the composite read command CMD_CPR and location information corresponding to the logical block address LBA6 to the die Die_2, to which the logical block address LBA6 is assigned, by referring to the L1 map data stored in the first memory 230. When mapping information of the logical block address LBA6 is not cached in the controller 200 or when a map cache miss of the logical block address LBA6 occurs, the controller 200 may transfer the composite read command CMD_CPR and the logical block address LBA6 to the nonvolatile memory device 100.

The controller 200 may identify the location information of a L2P entry corresponding to the logical block address LBA6 by referring to the L1 map data loaded to the first memory 230. For example, the location information of the L2P entry corresponding to the logical block address LBA6 may include the start physical block address of the location where an L2 map chunk L2_map_Chunk0 (see FIG. 4) including the L2P entry corresponding to the logical block address LBA6 is stored, and the offset of the L2P entry corresponding to the logical block address LBA6. That is, the controller 200 may transfer the composite read command CMD_CPR and the start physical block address and the offset corresponding to the logical block address LBA6 to the die Die_2 of the nonvolatile memory device 100.

In an embodiment, the composite read command CMD_CPR may be for performing a map read (or map conversion) operation of reading the mapping information of the L2P entry corresponding to the logical block address LBA6, i.e., a physical block address mapped to LBA6, from the L2P entry corresponding to the logical block address LBA6, the L2P entry being identified through the L1 map data having the location information (i.e., a start physical block address of an L2 map chunk including the L2P entry corresponding to LBA6, and an offset corresponding to the L2P entry corresponding to LBA6 within the L2 map chunk), and a data read operation of reading and outputting user data stored in a region of the physical block address mapped to LBA6.

Thus, as illustrated in FIG. 5B, the control logic 370 of the die Die_2 of the nonvolatile memory device 100 may read the L2 map chunk corresponding to the logical block address LBA6, based on the start physical block address for LBA6 received with the composite read command CMD_CPR, store the read L2 map chunk in the page buffer 350 (①), and read only the physical block address mapped to LBA6 from the L2 map chunk stored in the page buffer 350 based on the offset. Then, the control logic 370 may read the user data stored in a region of the read physical block address, store the read user data in the page buffer 350 (②), and then output the read user data to the controller 200.

In the related art, when a map cache miss occurs, the controller 200 transfers a map read command for reading a map segment to the nonvolatile memory device 100, the map segment including a logical block address where the map cache miss occurred. Furthermore, the controller 200 receives the map segment from the nonvolatile memory device 100 and caches the received map segment in the map cache buffer. Then, the controller 200 translates the logical block address into a corresponding physical block address by referring to the map segment cached in the map cache buffer, and transfers the translated physical block address and a data read command to the nonvolatile memory device 100.

As such, the controller 200 copes with the map cache miss by transferring two read commands to the nonvolatile memory device 100 and receiving map data and user data. However, the data transfer speed between the controller 200 and the nonvolatile memory device 100 is very low, and the read speed is significantly reduced because two read commands are transferred to receive the map data and the user data.

As described above, in embodiments of the present invention, the series of processes in which the controller 200 receives map data when a map cache miss occurs, translates a logical block address into a physical block address, and transfers a data read command for receiving user data to the translated physical block address can be omitted, which makes it possible to avoid reduction in read speed.

Figure 6A:
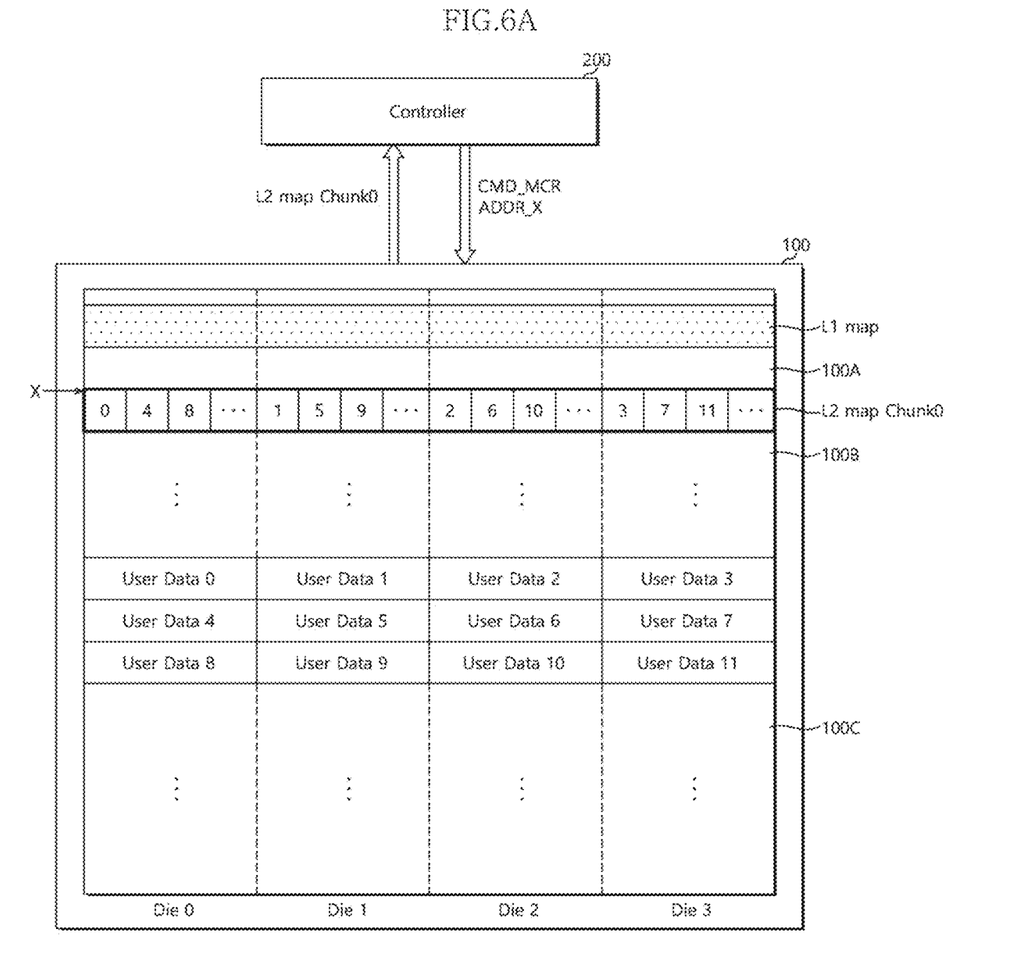
FIGS. 6A and 6B illustrate a map update operation in accordance with an embodiment.
Figure 6B:
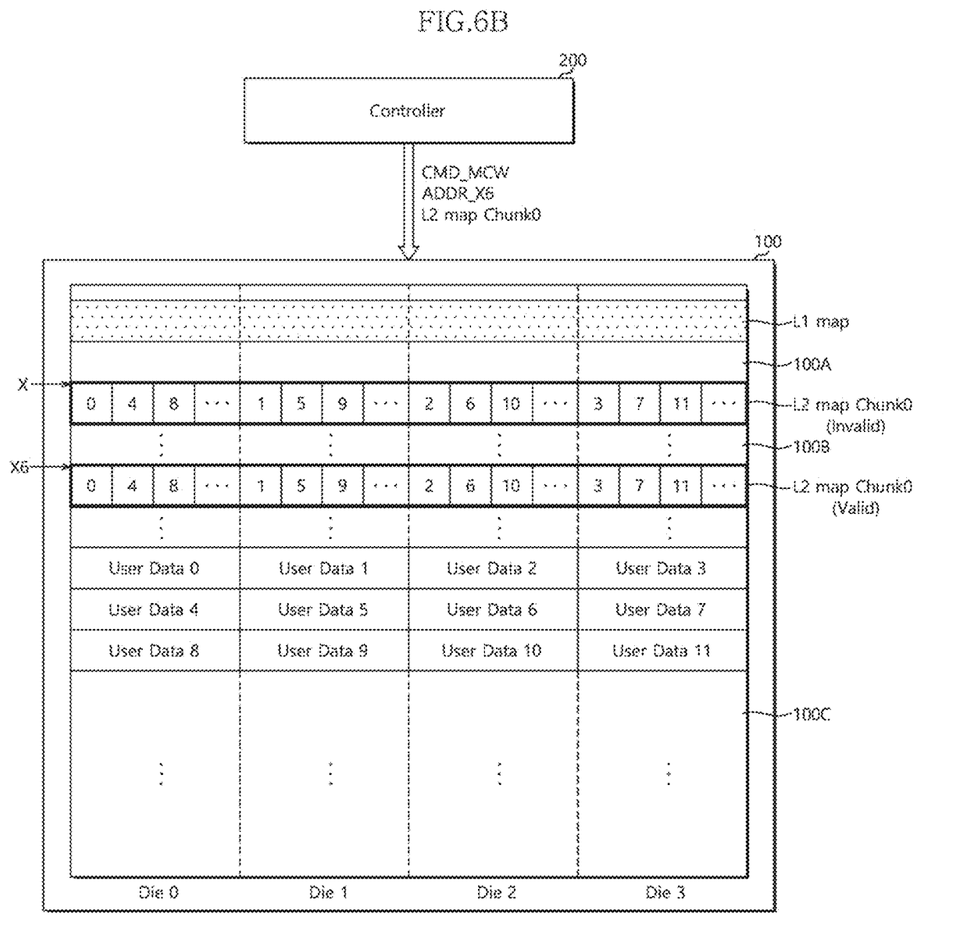

FIGS. 6A and 6B illustrate the map update operation in accordance with an embodiment.

Specifically, FIG. 6A illustrates an operation of reading an L2 map chunk including logical block addresses to be updated from the nonvolatile memory device 100, and FIG. 6B illustrates an operation of changing mapping information of the logical block addresses to be updated and then storing the changed mapping information in the nonvolatile memory device 100.

Referring to FIG. 6A, the controller 200 may transfer a map chunk read command CMD_MCR and a start physical block address X to the nonvolatile memory device 100, in order to read the L2 map chunk L2_map_Chunk0 including the logical block addresses to be updated. The nonvolatile memory device 100 may read the L2 map chunk L2_map_Chunk0 stored in a region corresponding to the start physical block address X, based on the map chunk read command CMD_MCR and the start physical block address X, and output the read L2 map chunk to the controller 200. The controller 200 may receive the L2 map chunk L2_map_Chunk0 outputted from the nonvolatile memory device 100, and store the received L2 map chunk in a memory.

Referring to FIG. 6B, the controller 200 may change mapping information (i.e., physical block addresses) of the logical block addresses to be updated in the L2 map chunk L2_map_Chunk0 stored in the memory, and transfer a map chunk write command CMD_MCW, a start physical block address X6 and the updated L2 map chunk L2_map_Chunk0 to the nonvolatile memory device 100. The nonvolatile memory device 100 may store the updated L2 map chunk L2_map_Chunk0 based on the map chunk write command CMD_MCW and the start physical block address X6. As the recent location information indicating where the L2 map chunk (L2_map_Chunk0) is stored is changed, the controller 200 may update the location information corresponding to the L2_map_Chunk0 within the L1 map data stored in the first memory 230.

Figure 7:
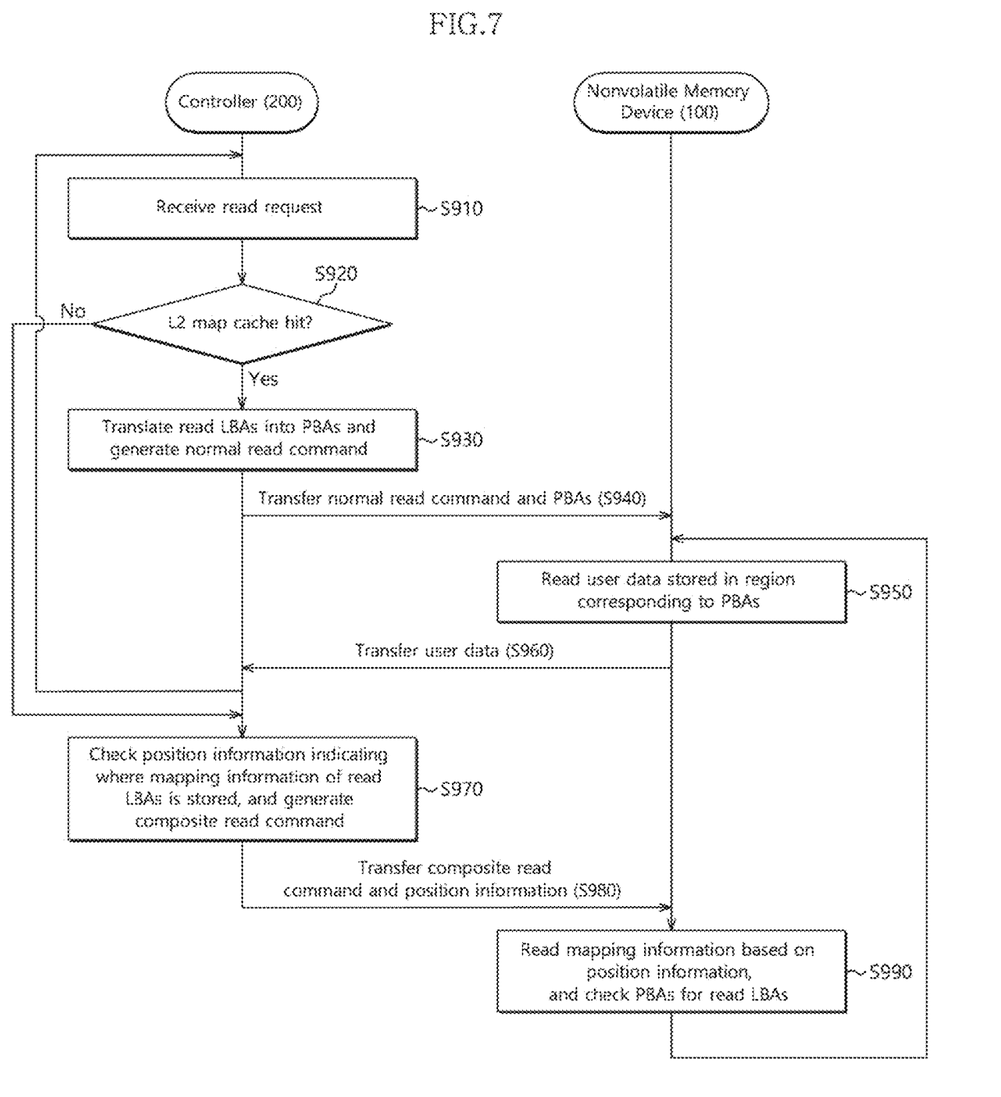
FIG. 7 is a flowchart illustrating an operating method of the data storage device in accordance with an embodiment.

FIG. 7 is a flowchart illustrating an operating method of the data storage device in accordance with an embodiment. In describing such method, one or more of FIGS. 1 to 6B may be referred to, in addition to FIG. 7.

At step S910, the controller 200 may receive a read request and logical block addresses LBAs from the host device (not illustrated).

At step S920, the controller 200 may determine whether mapping information of the logical block addresses LBAs received from the host device is cached in the second memory 240, that is, whether an L2 map cache hit occurs. When it is determined that an L2 map cache miss occurs, instead of the L2 map cache hit, the procedure may proceed to step S970. When it is determined that the L2 map cache hit occurs, the procedure may proceed to step S930.

At step S930, the controller 200 may translate the logical block addresses LBAs into physical block addresses PBAs, and generate a normal read command.

At step S940, the controller 200 may transfer the generated normal read command and the translated physical block addresses PBAs to the nonvolatile memory device 100.

At step S950, the nonvolatile memory device 100 may read user data from a region corresponding to the translated physical block addresses PBAs, based on the received normal read command and the translated physical block addresses PBAs.

At step S960, the nonvolatile memory device 100 may transfer the read user data to the controller 200, thereby completing the normal read operation. Then, the procedure may proceed to step S910.

At step S970, the controller 200 may identify location information indicating a L2P entry corresponding to the logical block addresses LBAs by referring to the L1 map data loaded in the first memory 230, and generate a composite read command. The location information of the L2P entry corresponding to the logical block addresses LBAs may include the start physical block address of an L2 map chunk including the L2P entry corresponding to the logical block addresses LBAs, and the offset of the L2P entry corresponding to the logical block addresses LBAs. Since the composite read command has described above, further description thereof is omitted here.

At step S980, the controller 200 may transfer the generated composite read command and the location information to the nonvolatile memory device 100.

At step S990, the nonvolatile memory device 100 may identify the mapping information of the logical block addresses LBAs, i.e. the physical block addresses PBAs mapped to the logical block addresses LBAs from the L2P entry identified by the location information. Then, the procedure may return to step S950.

In accordance with embodiments of the present invention, the nonvolatile memory device may translate a logical block address provided from the controller into a physical block address, read data from a region corresponding to the translated physical block address, and provide the read data to the controller, in response to the composite read command.

Therefore, it is possible to prevent a reduction in speed of the read operation even when mapping information of a logical block address corresponding to a read request is not cached in the controller.

Figure 8:
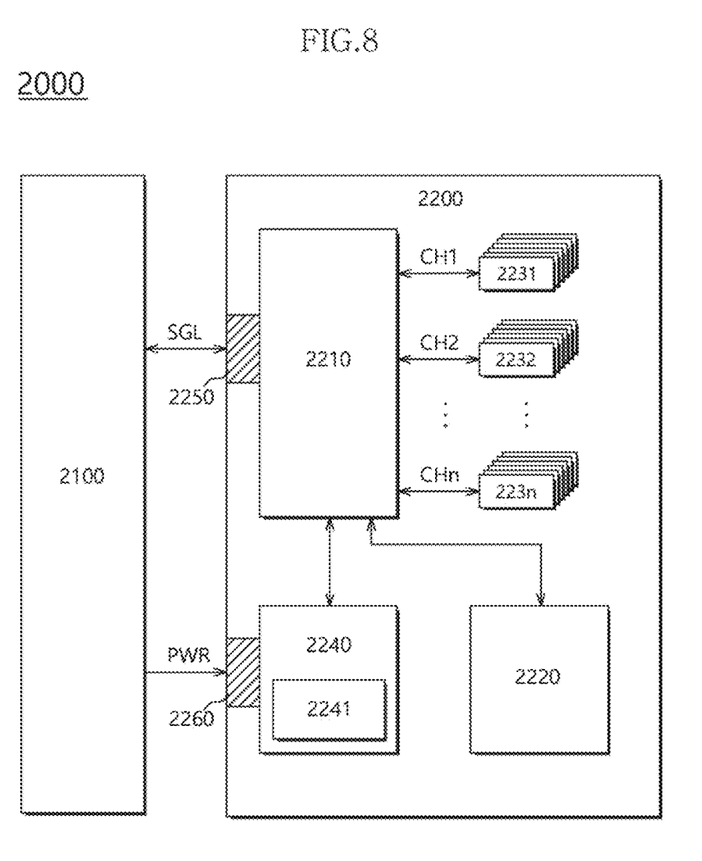
FIG. 8 illustrates a data processing system including a solid state drive (SSD) in accordance with an embodiment.

FIG. 8 illustrates a data processing system including a solid state drive (SSD) in accordance with an embodiment. Referring to FIG. 8, a data processing system 2000 may include a host apparatus 2100 and a SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is properly terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured as any of various types of connectors according to an interfacing method between the host apparatus 2100 and the SSD 2200.

Figure 9:
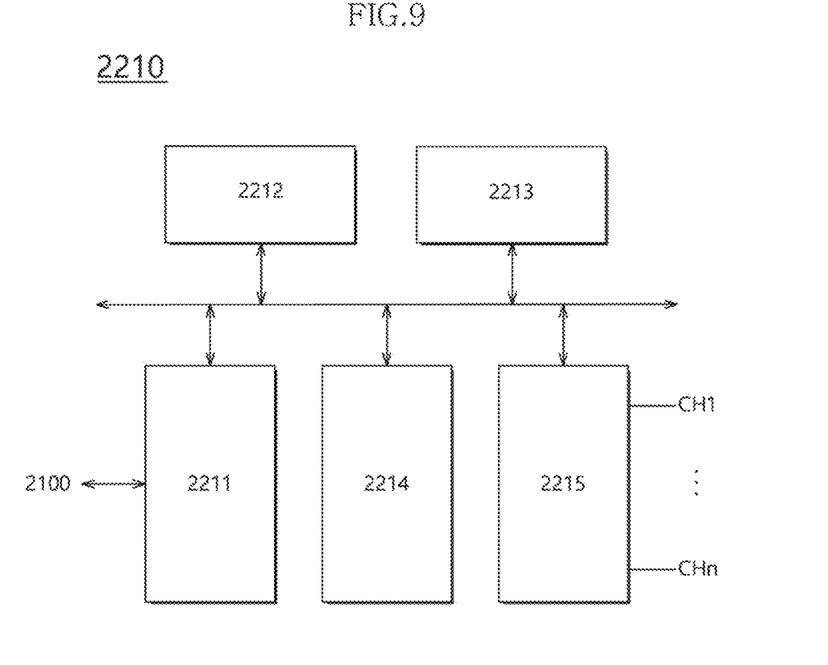
FIG. 9 illustrates a controller, such as that illustrated in FIG. 8.

FIG. 9 illustrates the controller 2210 of FIG. 9. Referring to FIG. 8, the controller 2210 may include a host interface 2211, a control component 2212, a random access memory (RAM) 2213, an error correction code (ECC) component 2214, and a memory interface 2215.

The host interface 2211 may perform interfacing between the host apparatus 2100 and the SSD 2200 according to a protocol of the host apparatus 2100. For example, the host interface 2211 may communicate with the host apparatus 2100 through any of a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface 2211 may perform a disc emulation function that the host apparatus 2100 recognizes the SSD 2200 as a general-purpose data storage apparatus, for example, a hard disc drive HDD.

The control component 2212 may analyze and process the signal SGL input from the host apparatus 2100. The control component 2212 may control operations of internal functional blocks according to firmware and/or software for driving the SDD 2200. The RAM 2213 may be operated as a working memory for driving the firmware or software.

The ECC component 2214 may generate parity data for the data to be transferred to the nonvolatile memory devices 2231 to 223n. The generated parity data may be stored in the nonvolatile memory devices 2231 to 223n together with the data. The ECC component 2214 may detect errors for data read from the nonvolatile memory devices 2231 to 223n based on the parity data. When detected errors are within a correctable range, the ECC component 2214 may correct the detected errors.

The memory interface 2215 may provide a control signal such as a command and an address to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 10:
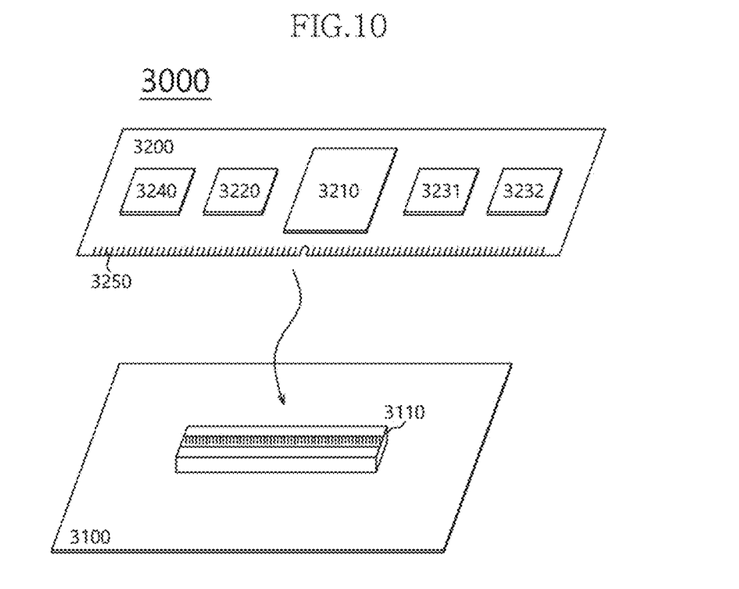
FIG. 10 illustrates a data processing system including a data storage apparatus in accordance with an embodiment.

FIG. 10 illustrates a data processing system including a data storage apparatus in accordance with an embodiment. Referring to FIG. 10, a data processing system 3000 may include a host apparatus 3100 and a data storage apparatus 3200.

The host apparatus 3100 may be configured in a board form such as a printed circuit board (PCB). Although not shown in FIG. 10, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 9.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any side of the data storage apparatus 3200.

Figure 11:
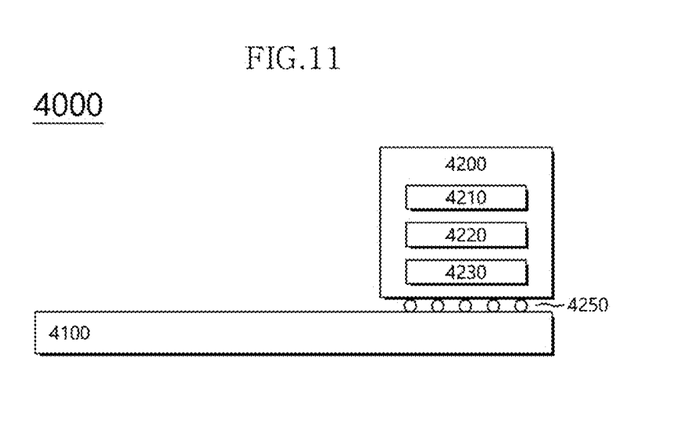
FIG. 11 illustrates a data processing system including a data storage apparatus in accordance with an embodiment.

FIG. 11 illustrates a data processing system including a data storage apparatus in accordance with an embodiment. Referring to FIG. 11, a data processing system 4000 may include a host apparatus 4100 and a data storage apparatus 4200.

The host apparatus 4100 may be configured in a board form such as a PCB. Although not shown in FIG. 11, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 9.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 12:
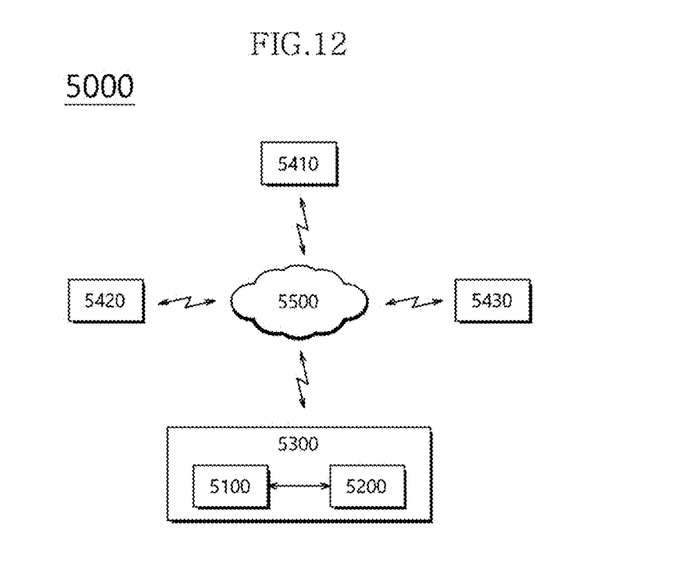
FIG. 12 illustrates a network system including a data storage apparatus in accordance with an embodiment.

FIG. 12 illustrates a network system 5000 including a data storage apparatus in accordance with an embodiment. Referring to FIG. 12, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the electronic apparatus 10 of FIG. 1, the data storage apparatus 2200 of FIG. 8, the data storage apparatus 3200 of FIG. 10, or the data storage apparatus 4200 of FIG. 11.

While various embodiments have been illustrated and described, it will be understood to those skilled in the art that the embodiments described are examples only. Accordingly, the present invention is not limited based on the described embodiments. Rather, the present invention encompasses all variations and modifications that fall within the scope of the claims and their equivalents.

What is claimed is:

1. A nonvolatile memory device comprising:
a plurality of dies each configured to store mapping information of logical block addresses which are previously assigned,
wherein when a composite read command and location information indicating where mapping information of a logical block address, of the logical block addresses, is stored are received from a controller, a target die corresponding to the logical block address among the plurality of dies performs a first operation of translating the logical block address to a physical block address based on the location information, and a second operation of reading user data stored in a region of the translated physical block address and outputting the read user data to the controller.

2. The nonvolatile memory device according to claim 1, wherein the location information indicating where the mapping information of the logical block address is stored comprises a start physical block address of a region where an L2 map chunk including the logical block address is stored and an offset corresponding to an order of the logical block address in the L2 map chunk.

3. The nonvolatile memory device according to claim 2, wherein the target die reads the L2 map chunk from a region corresponding to the start physical block address, and performs the first operation by referring to the mapping information of the logical block address corresponding to the offset in mapping information of a plurality of logical block addresses included in the read L2 map chunk.

4. The nonvolatile memory device according to claim 1, wherein each of the plurality of dies comprises:
a memory cell array;
control logic configured to control an operation of the memory cell array; and
command parsing logic configured to parse commands received from the controller, and provide the parsing result to the control logic.

5. The nonvolatile memory device according to claim 4, wherein the memory cell array comprises:
a map data region for storing a plurality of L2 map chunks each including logical-block-address to physical-block-address (L2P) entries; and
a system region for storing L1 map data having storage location information of the plurality of L2 map chunks.

6. A data storage device comprising:
a nonvolatile memory device comprising a plurality of dies, wherein each of the plurality of dies stores mapping information of logical block addresses which are previously assigned;
a memory configured to cache mapping information of a logical block address received from a host device; and
a controller configured to transfer a composite read command and location information to a target die among the plurality of dies, when a logical block address which is not cached in the memory is received from the host device, wherein the location information indicates where mapping information of the logical block address is stored, and the target die corresponds to the logical block address.

7. The data storage device according to claim 6, wherein the target die performs a first operation of translating the logical block address into a physical block address based on the location information and a second operation of reading user data stored in the translated physical block address and outputting the read user data to the controller.

8. The data storage device according to claim 7, wherein the location information indicating where the mapping information of the logical block address is stored comprises a start physical block address of a region where an L2 map chunk including the logical block address is stored and an offset corresponding to an order of the logical block address in the L2 map chunk.

9. The data storage device according to claim 8, wherein the target die reads the L2 map chunk from the region corresponding to the start physical block address, and performs the first operation by referring to the mapping information of the logical block address corresponding to the offset in mapping information of a plurality of logical block addresses included in the read L2 map chunk.

10. The data storage device according to claim 6, wherein when a logical block address cached in the memory is received from the host, the controller translates the logical block address into a physical block address, and transfers a normal read command and the translated physical block address to the nonvolatile memory device.

11. An operating method of a data storage device which includes a nonvolatile memory device including a plurality of dies configured to store mapping information of a previously assigned logical block address group and a controller configured to control the nonvolatile memory device, the operating method comprising:
determining, by the controller, whether a map cache hit for a logical block address received from a host device occurs;
transferring, by the controller, a composite read command and location information to a target die corresponding to the logical block address, the location information indicating where mapping information of the logical block address is stored, when it is determined that a map cache miss occurs; and
performing, by the target die, a first operation of translating the logical block address into a physical block address based on the location information and a second operation of reading user data stored in a region of the physical block address and outputting the read user data to the controller.

12. The operating method according to claim 11, wherein the location information indicating where the mapping information of the logical block address is stored comprises a start physical block address of a region where an L2 map chunk including the logical block address is stored and an offset corresponding to an order of the logical block address in the L2 map chunk.

13. The operating method according to claim 12, wherein the target die reads the L2 map chunk from the region corresponding to the start physical block address, and performs the first operation by referring to the mapping information of the logical block address corresponding to the offset in mapping information of a plurality of logical block addresses included in the read L2 map chunk.

14. The operating method according to claim 11, further comprising translating, by the controller, the logical block address into a physical block address, and transferring a normal read command and the translated physical block address to the nonvolatile memory device, when it is determined that the map cache hit occurs, after determining whether the map cache hit occurs.

* * * * *